United States Patent
Lecamp et al.

(10) Patent No.: US 10,147,894 B2
(45) Date of Patent: *Dec. 4, 2018

(54) TRANSPARENT DIFFUSIVE OLED SUBSTRATE AND METHOD FOR PRODUCING SUCH A SUBSTRATE

(71) Applicant: SAINT-GOBAIN GLASS FRANCE, Courbevoie (FR)

(72) Inventors: Guillaume Lecamp, Paris (FR); Vincent Sauvinet, Grenoble (FR); Nicolas Chemin, Bagneux (FR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 148 days.

This patent is subject to a terminal disclaimer.

(21) Appl. No.: 14/891,577

(22) PCT Filed: Apr. 29, 2014

(86) PCT No.: PCT/EP2014/058738
§ 371 (c)(1),
(2) Date: Nov. 16, 2015

(87) PCT Pub. No.: WO2014/183993
PCT Pub. Date: Nov. 20, 2014

(65) Prior Publication Data
US 2016/0072083 A1 Mar. 10, 2016

(30) Foreign Application Priority Data

May 13, 2017 (EP) .................................... 13168341

(51) Int. Cl.
*G02B 1/11* (2015.01)
*G02B 5/02* (2006.01)
(Continued)

(52) U.S. Cl.
CPC .......... *H01L 51/0096* (2013.01); *C03C 3/064* (2013.01); *C03C 8/02* (2013.01);
(Continued)

(58) Field of Classification Search
None
See application file for complete search history.

(56) References Cited

U.S. PATENT DOCUMENTS 9,412,958 B2 * 8/2016 Lecamp ............. H01L 51/0096
2004/0156110 A1 8/2004 Ikeyama
(Continued)

FOREIGN PATENT DOCUMENTS

EP 0 658 525 A2 6/1995
EP 1 860 919 A1 11/2007
(Continued)

OTHER PUBLICATIONS

International Search Report as issued in International Patent Application No. PCT/EP2014/058738, dated Jul. 28, 2014.
(Continued)

*Primary Examiner* — Derek S Chapel
(74) *Attorney, Agent, or Firm* — Pillsbury Winthrop Shaw Pittman LLP

(57) ABSTRACT

A transparent diffusive OLED substrate includes (a) a transparent flat substrate made of mineral glass having a refractive index of between 1.45 and 1.65, (b) a rough low index layer including mineral particles, the mineral particles being attached to one side of the substrate by means of a sol-gel mineral binder, the mineral particles near, at or protruding from the mineral binder's surface creating a surface roughness characterized by an arithmetical mean deviation Ra comprised between 0.15 and 3 μm, the mineral particles and mineral binder both having a refractive index of between 1.45 and 1.65; (c) a high index layer made of an enamel (Continued)

Figure 1:
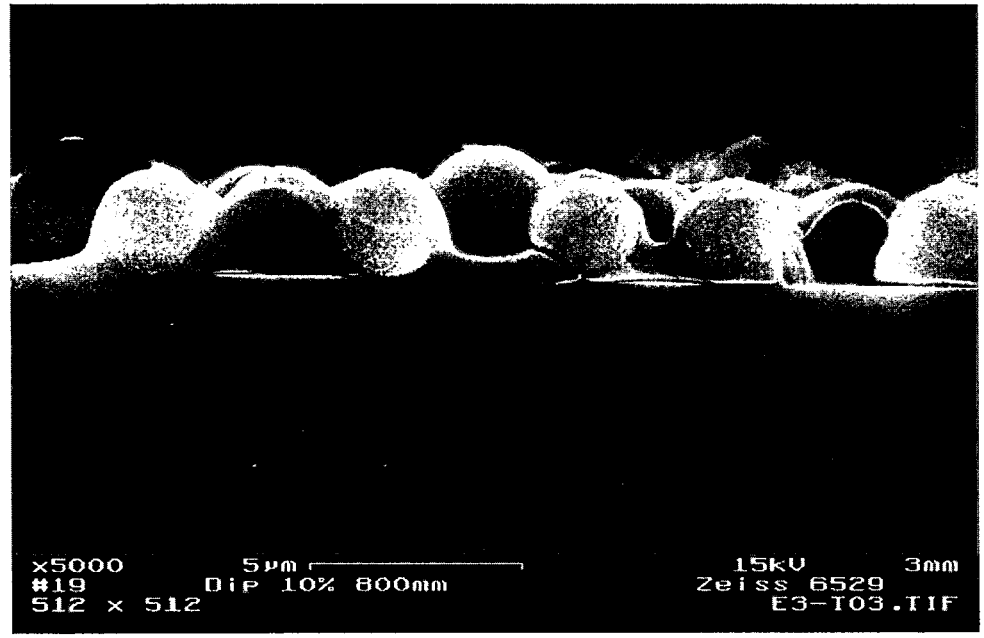

having a refractive index comprised between 1.8 and 2.1 covering the rough low index layer.

30 Claims, 1 Drawing Sheet

(51) Int. Cl.
    *H01L 51/00* (2006.01)
    *C03C 3/064* (2006.01)
    *C03C 8/02* (2006.01)
    *C03C 17/34* (2006.01)
    *H01L 51/52* (2006.01)

(52) U.S. Cl.
    CPC ............ *C03C 17/3417* (2013.01); *G02B 1/11* (2013.01); *G02B 5/0221* (2013.01); *G02B 5/0226* (2013.01); *G02B 5/0242* (2013.01); *H01L 51/5268* (2013.01); *C03C 2217/46* (2013.01); *C03C 2217/478* (2013.01); *C03C 2217/734* (2013.01)

(56) References Cited

U.S. PATENT DOCUMENTS

| | | |
|---|---|---|
| 2011/0001153 A1 | 1/2011 | Tchakarov et al. |
| 2012/0155093 A1* | 6/2012 | Yamada .............. H01L 51/5275 362/311.01 |
| 2012/0313134 A1 | 12/2012 | Vermersch et al. |
| 2013/0114269 A1* | 5/2013 | Domercq ............ H01L 51/5215 362/311.05 |
| 2016/0087228 A1* | 3/2016 | Lecamp .................. C03C 3/066 428/149 |
| 2017/0307790 A1* | 10/2017 | Bellman .................. G02B 1/14 |
| 2017/0352841 A1* | 12/2017 | Lee ......................... H01L 51/56 |

FOREIGN PATENT DOCUMENTS

| | | |
|---|---|---|
| EP | 2 178 343 A1 | 4/2010 |
| EP | 2 203 030 A1 | 6/2010 |
| EP | 2 278 852 A1 | 1/2011 |
| EP | 2 490 506 A1 | 8/2012 |
| EP | 2 712 851 A1 | 4/2014 |
| JP | 2006-286616 A | 10/2006 |
| JP | 2008-210717 A | 9/2008 |
| JP | 2009-076452 A | 4/2009 |
| JP | 2011-504640 A | 2/2011 |
| WO | WO 2009/116531 A1 | 7/2011 |
| WO | WO 2011/089343 A1 | 7/2011 |
| WO | WO 2011/046190 A1 | 3/2013 |

OTHER PUBLICATIONS

Notice of Reasons for Rejection as issued in Japanese Patent Application No. 2016-513270, dated Feb. 20, 2018.

* cited by examiner

TRANSPARENT DIFFUSIVE OLED SUBSTRATE AND METHOD FOR PRODUCING SUCH A SUBSTRATE

CROSS-REFERENCE TO RELATED APPLICATIONS

This application is the U.S. National Stage of PCT/EP2014/058738, filed Apr. 29, 2014, which in turn claims priority to European patent application number 13168341.9 filed May 17, 2013. The content of these applications are incorporated herein by reference in their entireties.

The present invention is drawn to a new method for producing translucent, light-scattering substrates for organic light emitting diodes (OLED) and to substrates obtainable by such a method.

OLEDs are opto-electronic elements comprising a stack of organic layers with fluorescent or phosphorescent dyes sandwiched between two electrodes, at least one of which is translucent. When a voltage is applied to the electrodes the electrons injected from the cathode and the holes injected from the anode recombine within the organic layers, resulting in light emission from the fluorescent/phosphorescent layers.

It is commonly known that light extraction from conventional OLEDs is rather poor, most of the light being trapped by total internal reflection in the high index organic layers and transparent conductive layers (TCL). Total internal reflection takes place not only at the boundary between the high index TCL and the underlying glass substrate (refractive index of about 1.5) but also at the boundary between the glass and the air.

According to estimates, in conventional OLEDs not comprising any additional extraction layer about 60% of the light emitted from the organic layers is trapped at the TCL/glass boundary, an additional 20% fraction is trapped at the glass/air surface and only about 20% exit the OLED into air.

It is known to reduce this light entrapment by means of a light scattering layer between the TCL and the glass substrate. Such light scattering layers have a high refractive index close to the TCL index and contain a plurality of light diffusing elements.

It is also known to increase out-coupling of light by texturing the interface between the glass and the high index layers of the OLED.

Both of these "internal" extraction means, also commonly called "internal extraction layers" (IEL), comprise asperities that need to be planarized before applying the TCL and the organic stack.

WO2011/089343 discloses OLED substrates comprising at least one textured surface planarized with a high index glass coating. The substrates are described as being texturized by acid etching. Glass etching using strong acids, in particular HF, is a commonly used method for texturizing glass surfaces. Such a wet chemistry method however is a complicated process when carried out on thin glass (thickness <1 mm). This technique allows only for one of the two faces to be etched per process step as the glass plate has to be kept in a horizontal position during the etching step. Furthermore the roughness profile parameters are difficult to optimize and above all the use of HF results in important security problems for the environment and persons working nearby.

The applicant has recently developed an interesting alternative method for roughening one or both sides of the glass substrate, said method comprising mechanical roughening (lapping). This method, described in European application 12306179.8 filed on Sep. 28, 2012, is much less hazardous than chemical etching, allows for better control of the roughness profile and makes it possible to simultaneously roughen both sides of the substrates, thereby producing in a single process step the internal and external extraction layers (IEL and EEL) of a transparent OLED glass substrate.

The present invention is drawn to still another method for producing diffusive low index glass substrates, said method comprising neither a chemical etching step nor a mechanical abrasion step. The idea underlying the present invention is to bond low index mineral particles by means of a low index mineral binder to a low index glass substrate, the amount of mineral binder with respect to the mineral particles being sufficiently low so that the mineral particles protrude from the binder surface or, at least, create significant roughness at the mineral binder surface.

The resulting diffusive low index substrate is then submitted to a commonly known planarization step using a high index frit, and the resulting planarized diffusive substrate may then be coated with a transparent conductive layer (TCL) and be used as a light-extraction substrate for OLEDs.

The method of the present invention is easy to implement, requiring only rather simple and commonly known equipment. One significant advantage over the lapping method described in EP 12306179.8 is that it may be used for very large surfaces. It is further advantageous because it does not weaken the mechanical strength of the substrate, an inconvenient that can be observed for large surface etched or lapped glass substrates.

The first subject-matter of the present invention is a transparent diffusive OLED substrate comprising the following successive elements or layers:
 (a) a transparent flat substrate made of mineral glass having a refractive index of between 1.45 and 1.65,
 (b) a rough low index layer comprising mineral particles, said mineral particles being attached to one side of the substrate by means of a sol-gel mineral binder, the mineral particles near, at or protruding from the mineral binder's surface creating a surface roughness characterized by an arithmetical mean deviation $R_a$ comprised between 0.15 and 3 µm, the mineral particles and mineral binder both having a refractive index of between 1.45 and 1.65;
 (c) a high index layer made of an enamel having a refractive index comprised between 1.8 and 2.1 covering the rough low index layer (b).

The present invention also provides a method for preparing a diffusive substrate as defined above.

The term "sol-gel mineral binder" refers to a mineral solid obtained by a sol-gel process from small precursors, generally metal alkoxides. This process involves conversion of the precursors, for example metal tetraalkoxides, into a colloidal solution (sol) that progressively forms an integrated polymer network (gel) which is then dried and further compacted by firing.

The low index layer of the OLED substrate of the present invention is defined by its refractive index (1.45-1.65) and by its surface roughness profile, i.e. an arithmetical mean deviation $R_a$ (such as defined in ISO 4287) comprised between 0.15 and 3 µm.

Said roughness is created by the mineral particles near, at or protruding from the mineral binder's surface. The mineral particles do not necessarily need to protrude from the mineral binder but may be embedded in the mineral binder layer as long as it is apparent, for example from a sectional SEM view, that the roughness or waviness can be attributed to the underlying particles, the surface profile closely matching the presence/absence of embedded mineral particles.

The mineral particles used in the present invention may be crystalline, amorphous or semi-crystalline particles. They may have a random shape with more or less sharp edges but preferably are rather spherical particles free of sharp edges.

In a preferred embodiment, the mineral particles are solid beads. Such beads are preferred over randomly-shaped sharp-edged particles because they easily spread over the substrate's surface thereby facilitating formation of a thin monolayer of beads, rather than large sized aggregates. Sphere-like particles devoid of sharp edges are also more easily planarized than randomly shaped particles. It is to be understood that hollow beads are not encompassed in the definition of mineral particles of the present invention, because the gas contained therein has a refractive index not comprised between 1.45 and 1.65.

The term "mineral particle", especially when used to describe the method of the present invention, encompasses particles functionalized with organic surface groups, such as trialkylsilyl groups. Said organic surface groups undergo thermal decomposition during the firing step of the sol-gel mineral binder or during the formation of the high index enamel layer.

The mineral particles used in the present invention, whether spherical or not, have an average equivalent spherical diameter (measured by DLS) of between 0.3 μm and 10 μm, preferably of between 0.5 μm and 8 μm, more preferably of between 0.8 μm and 7 μm, the equivalent spherical diameter of the irregularly shaped particles being defined as the diameter of the sphere having the same volume as the mineral particle.

The average equivalent spherical diameter however is not the only size parameter to consider for selecting the mineral particles to be used in the present invention. Advantageously, the mineral particles are essentially free of large sized particles, which would protrude not only from the mineral binder but also from the high index enamel layer, which would then lead to current leakage in the final OLED. The mineral particles used in the present invention consequently are essentially devoid of particles having an equivalent spherical diameter higher than 15 μm, preferably higher than 12 μm.

As already specified above, the glass substrate, the mineral particles and the mineral binder all have about the same refractive index, comprised between 1.45 and 1.65, preferably between 1.50 and 1.60.

In a preferred embodiment of the present invention, the mineral particles are selected from silica particles.

In order to obtain diffusive substrates from ingredients all having about the same refractive index, it is necessary to create and control the surface roughness of the low index mineral layer. As mentioned above, the low index mineral layer should have an arithmetical mean deviation $R_a$ comprised between 0.15 and 3 μm, preferably between 0.2 and 2 μm.

The arithmetical mean deviation $R_a$ is defined in ISO 4287. It may be measured by scanning electron microscopy (SEM) of cross sections of the sample, by surface profile measurement or by 3D laser microscopy.

To obtain a mineral layer having both a suitable surface roughness and a satisfactory mechanical resistance, it is important to appropriately select the amount of mineral binder with respect to the amount of mineral particles. If one uses too high amounts of mineral binder, the mineral particles will be completely embedded in the resulting low index mineral binder matrix and will not create the required surface roughness ($R_a$) of between 0.15 and 3 μm. On the other hand, in case the amount of mineral binder is too low with respect to the mineral particles, the bonding strength of the mineral binder is too weak and the resulting mineral layer will be excessively brittle and easily damaged when handled.

The applicant found that a weight ratio of mineral particles to the dry matter of the sol comprised between 0.2 and 4, preferably between 0.4 and 3, leads to a suitable surface roughness and mechanical resistance of the low index layer. The expression "dry matter of the sol" refers to the dry weight of the condensed three-dimensional mineral network obtained from the sol.

The final low index mineral layer may also be characterized by the volume ratio of the mineral particles to the mineral binder which is preferably comprised between 0.3 and 3, preferably between 0.5 and 2 and more preferably between 0.7 and 1.5.

The high index enamel (c) on the low index mineral layer (b) should be thick enough to completely cover and planarize the roughness profile thereof.

The thickness of the high index layer is advantageously comprised between 3 μm and 20 μm, preferably between 4 μm and 15 μm and more preferably between 5 μm and 12 μm. The thickness of the high index layer is the mean distance between the mean lines (defined as in ISO 4287, 3.1.8.1) of the roughness profile of the low index layer and the roughness profile of the high index layer.

The surface roughness of the high index layer should be preferably as low as possible and the high index enamel advantageously has an arithmetical mean deviation $R_a$ of less than 3 nm, more preferably less than 2 nm and most preferably less than 1 nm.

The high index layer is preferably essentially free of diffusive elements dispersed therein, especially free of diffusive solid particles dispersed therein. As a matter of fact such solid diffusive particles could undesirably protrude from the surface of the high index layer and cause leakage currents in the final OLED.

The resulting flat glass substrate carrying the low index mineral layer (low index particles+sol-gel mineral binder) planarized by the high index glass frit generally has a haze comprised between 75 and 98%, preferably between 85 and 97%, and more preferably between 87 and 95%. Haze value can be measured by optical spectrophotometers like PE Lambda 950 or Varian Carry 5000, but also by faster and cheaper dedicated device like BYK Hazemeter.

In a preferred embodiment, the transparent diffusive OLED substrate of the present invention further comprises a transparent electro-conductive layer (d) preferably directly in contact with the high index enamel layer (c). Such transparent conductive layers that may be used as anodes for OLEDs are well known in the art. The most commonly material used is ITO (Indium Tin Oxide). The transparent conductive layer should have a light transmission of at least 80%, and a refractive index of between 1.8 and 2.2. Its total thickness is typically comprised between 50 and 400 nm.

As mentioned above the present invention is also drawn to a method for preparing the OLED substrate of the present invention The method comprises the following successive steps:
(1) Providing a transparent flat substrate made of mineral glass having a refractive index of between 1.45 and 1.65;
(2) Dispersing mineral particles having a refractive index of between 1.45 and 1.65 in a sol of at least one precursor of a mineral binder having a refractive index of between 1.45 and 1.65;

(3) Applying the resulting dispersion onto one side of the substrate, (4) Drying and firing the resulting layer by heating thereby obtaining a transparent rough low index layer comprising mineral particles and a mineral binder, (5) Applying onto said rough low index layer a layer of high index glass frit having a refractive index of between 1.8 and 2.1, (6) Drying and fusing said glass frit so as to obtain a high index enamel layer having a refractive index comprised between 1.8 and 2.1 covering the rough low index layer.

The flat glass substrates provided at step (1) generally have a thickness of between 0.1 and 5 mm, preferably of between 0.3 and 1.6 mm.

At step (2) the mineral particles as described earlier are dispersed in a sol of at least one precursor of a mineral binder. Said precursor preferably is selected from the group consisting of sodium silicate, potassium silicate, lithium silicate, tetra-alcoxysilanes, preferably tetra-ethoxysilanes, titanium alcoxydes, aluminium alkoxides, zirconium alkoxides, or mixtures thereof. Zirconium alkoxides and titanium alkoxides are used in admixture with other precursors in amounts low enough to not exceed the maximum refractive index (1.65) of the final mineral binder.

The resulting slurry is then applied onto one side of the flat substrate, by known methods such as for example dip coating, roll coating, spin coating, slot coating.

The solvent of the sol phase is then evaporated and the dried layer is submitted to a firing step. The drying and firing at step (4) is advantageously carried out by heating at a temperature of at least 100° C., preferably of 100° C. to 300° C., more preferably of 110 to 200° C. When the mineral particles used are organo-modified particles carrying organic surface groups, such as alkylsilyl groups, the baking should be implemented at a temperature sufficiently high to effect thermal decomposition of these surface groups.

At step (5) the high index glass frit is then applied onto the baked low index rough layer by any suitable method such as screen printing, spray coating, bar coating, roll coating, slot coating and spin coating, of an aqueous or organic suspension of glass particles. A description of suitable high index glass frits and methods for coating and firing them can be found for example in EP 2 178 343.

The glass frit should be selected to have a melting point comprised between 450° C. and 570° C. and should lead to an enamel having a refractive index of 1.8 to 2.2.

Preferred glass frits have the following composition:
$Bi_2O_3$: 55-75 wt %
BaO: 0-20 wt %
ZnO: 0-20 wt %
$Al_2O_3$: 1-7 wt %
$SiO_2$: 5-15 wt %
$B_2O_3$: 5-20 wt %
$Na_2O$: 0.1-1 wt %
$CeO_2$: 0-0.1 wt %

In a typical embodiment, the glass frit particles (70-80 wt %) are mixed with 20-30 wt % of an organic vehicle (ethyl cellulose and organic solvent). The resulting frit paste is then applied onto the diffusive coated glass substrate by screen printing or slot coating. The resulting layer is dried by heating at a temperature of 120-200° C. The organic binder (ethyl cellulose) is burned out at a temperature of between 350-440° C., and the firing step resulting in the final enamel is carried out at a temperature of between 510° C. and 610° C., preferably between 520° C. and 600° C.

The resulting enamels have been shown to have a surface roughness with an arithmetical mean deviation $R_a$ (ISO 4287) of less than 3 nm when measured by AFM on an area of 10 µm×10 µm.

The amount of the high index glass frit coated onto the roughened surface is generally comprised between 20 and 200 $g/m^2$, preferably between 25 and 150 $g/m^2$, more preferably between 30 and 100 $g/m^2$, and most preferably between 35 and 70 $g/m^2$.

The high index glass frit used in the present invention and the enamel resulting therefrom preferably are substantially devoid of solid scattering particles such as crystalline $SiO_2$ or $TiO_2$ particles. Such particles are commonly used as scattering elements in high index scattering layers but generally require an additional planarization layer, thereby increasing the total thickness of the high index coating.

The diffusive substrates planarized with a high index enamel are particularly useful as substrates for bottom-emitting OLEDs. A transparent conductive layer has to be applied on top of the high index enamel before application of the stack of organic light emitting layers.

In a preferred embodiment, the method of the present invention therefore further comprises an additional step of coating the high index enamel resulting from step (6) with a transparent conductive layer, preferably a transparent conductive oxide. Formation of such a TCL may be carried out according to conventional methods such as magnetron sputtering.

EXAMPLE 20 g of organo-modified silica beads having an average diameter of 2.5 µm are dispersed in 150 g of 2-methoxy-propanol and dispersed by ultrasound. To this dispersion are added 30 g of Xenios® Surface Perfection (Evonik GmbH). The resulting dispersion is then applied by dip-coating onto a clean glass substrate and dried for about one minute at 120° C. The dried coated substrate is then heated at a rate of 5° C./minute to a temperature of 500° C. and fired for 5 minutes at this temperature.

Figure 2:
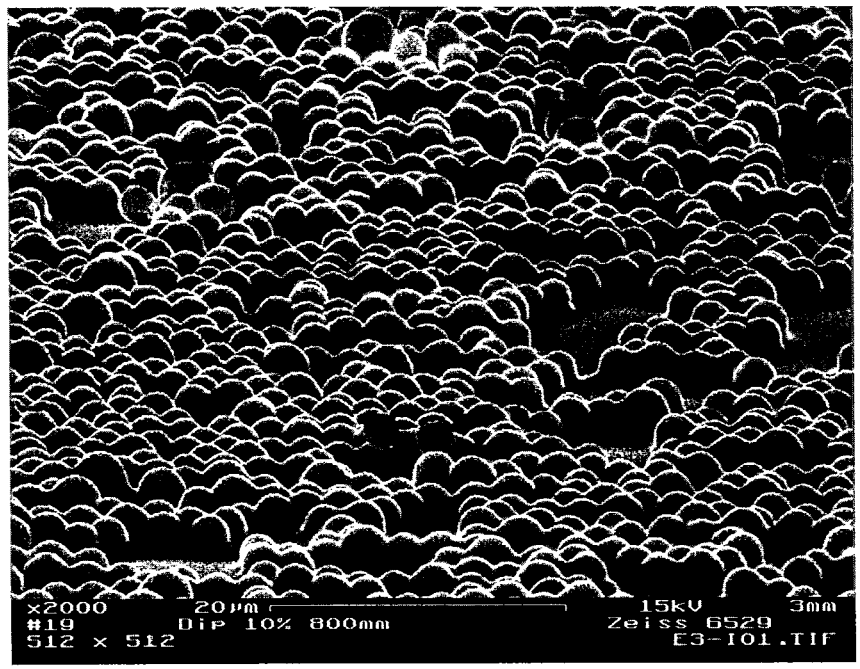

FIGS. 1 and 2 show SEM micrographs of the rough low index layer after firing and before planarization with the high index frit. One can see that the spherical particles are spread in form of a rather tightly packed monolayer over the glass substrate.

The resulting low index rough layer was then coated by screen-printing with a slurry of a high index frit (n=1.90). The coating was dried at 150° C. and was submitted to firing for 10 minutes at 545° C. in an IR furnace.

The invention claimed is:

1. A transparent diffusive OLED substrate comprising the following successive elements or layers:
   (a) a transparent flat substrate made of mineral glass having a refractive index of between 1.45 and 1.65;
   (b) a rough low index layer comprising mineral particles, said mineral particles being attached to a side of the substrate by means of a sol-gel mineral binder, the mineral particles near, at or protruding from the mineral binder's surface creating a surface roughness characterized by an arithmetical mean deviation $R_a$ comprised between 0.15 and 3 µm, the mineral particles and mineral binder both having a refractive index of between 1.45 and 1.65;
   (c) a high index layer made of an enamel having a refractive index comprised between 1.8 and 2.1 covering the rough low index layer.

2. The substrate according to claim 1, wherein the mineral particles have an average equivalent spherical diameter of between 0.3 µm and 10 µm.

3. The substrate according to claim 2, wherein the average equivalent spherical diameter is between 0.5 µm and 8 µm.

4. The substrate according to claim 3, wherein the average equivalent spherical diameter is between 0.8 µm and 7 µm.

5. The substrate according to claim 1, wherein the mineral particles are solid beads.

6. The substrate according to claim 1, wherein the mineral particles are essentially free of particles having an equivalent spherical diameter higher than 15 µm.

7. The substrate according to claim 6, wherein the mineral particles are essentially free of particles having an equivalent spherical diameter higher than 12 µm.

8. The substrate according to claim 1 wherein the refractive index of the substrate, mineral binder and mineral particles is comprised between 1.50 and 1.60.

9. The substrate according to claim 1, wherein the thickness of the high index layer is comprised between 3 µm and 20 µm.

10. The substrate according to claim 9, wherein the thickness of the high index layer is comprised between 4 µm and 15 µm.

11. The substrate according to claim 10, wherein the thickness of the high index layer is comprised between 5 µm and 12 µm.

12. The substrate according to claim 1, wherein the surface roughness of the high index layer has an arithmetical mean deviation $R_a$ of less than 3 nm.

13. The substrate according to claim 12, wherein the arithmetical mean deviation $R_a$ of the surface roughness of the high index layer is less than 2 nm.

14. The substrate according to claim 13, wherein the arithmetical mean deviation $R_a$ of the surface roughness of the high index layer is less than 1 nm.

15. The substrate according to claim 1, wherein the high index layer is essentially free of diffusive elements dispersed therein.

16. The substrate according to claim 15, wherein the high index layer is free of diffusive solid particles dispersed therein.

17. The substrate according to claim 1, wherein the mineral particles are selected from silica particles.

18. The substrate according to claim 1, further comprising a transparent electro-conductive layer on the high index enamel layer.

19. The substrate according to claim 1, wherein the volume ratio of the mineral particles to the mineral binder is comprised between 0.3 and 3.

20. The substrate according to claim 19, wherein the volume ratio of the mineral particles to the mineral binder is comprised between 0.5 and 2.

21. The substrate according to claim 20, wherein the volume ratio of the mineral particles to the mineral binder is comprised between 0.7 and 1.5.

22. A method for preparing a transparent diffusive substrate according to claim 1, comprising:
    (1) providing a transparent flat substrate made of mineral glass having a refractive index of between 1.45 and 1.65;
    (2) dispersing mineral particles having a refractive index of between 1.45 and 1.65 in a sol of at least one precursor of a mineral binder having a refractive index of between 1.45 and 1.65;
    (3) applying the resulting dispersion onto a side of the substrate;
    (4) drying and firing the resulting layer by heating thereby obtaining a transparent rough low index layer comprising mineral particles and a mineral binder;
    (5) applying onto said rough low index layer a layer of high index glass frit having a refractive index of between 1.8 and 2.1, and
    (6) drying and fusing said glass frit so as to obtain a high index enamel layer having a refractive index comprised between 1.8 and 2.1 covering the rough low index layer.

23. The method according to claim 22, wherein the at least one precursor of a mineral binder is selected from the group consisting of sodium, potassium or lithium silicate, tetra-alcoxysilanes, titanium alkoxides, aluminium alkoxides, and zirconium alkoxides.

24. The method according to claim 22, wherein the drying and firing of the resulting layer is carried out by heating at a temperature of at least 100° C.

25. The method according to claim 24, wherein the drying and firing of the resulting layer is carried out by heating at a temperature from 100° C. to 300° C.

26. The method according to claim 25, wherein the drying and firing of the resulting layer is carried out by heating at a temperature from 110 to 200° C.

27. The method according to claim 22, wherein the mineral particles have an average equivalent spherical diameter of between 0.3 µm and 10 µm.

28. The method according to claim 27, wherein the mineral particles have an average equivalent spherical diameter of between 0.5 µm and 8 µm.

29. The method according to claim 28, wherein the mineral particles have an average equivalent spherical diameter of between 0.8 µm and 7 µm.

30. The substrate according to claim 1, wherein the mineral particles and the mineral binder all have a same refractive index of between 1.50 and 1.60.

* * * * *

UNITED STATES PATENT AND TRADEMARK OFFICE
CERTIFICATE OF CORRECTION

PATENT NO. : 10,147,894 B2
APPLICATION NO. : 14/891577
DATED : December 4, 2018
INVENTOR(S) : Guillaume Lecamp et al.

Page 1 of 1

It is certified that error appears in the above-identified patent and that said Letters Patent is hereby corrected as shown below:

On the Title Page

Please correct Item (30) Foreign Application Priority Data filing date as follows:
May 17, 2013 (EP) ................................ 13168341

Signed and Sealed this
Fifth Day of March, 2019

Andrei Iancu
*Director of the United States Patent and Trademark Office*